US006891755B2

(12) United States Patent
Silvagni et al.

(10) Patent No.: US 6,891,755 B2
(45) Date of Patent: May 10, 2005

(54) ARCHITECTURE FOR A FLASH-EEPROM SIMULTANEOUSLY READABLE IN OTHER SECTORS WHILE ERASING AND/OR PROGRAMMING ONE OR MORE SECTORS

(75) Inventors: Andrea Silvagni, Milan (IT); Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 225 days.

(21) Appl. No.: 10/340,207

(22) Filed: Jan. 10, 2003

(65) Prior Publication Data

US 2003/0133325 A1 Jul. 17, 2003

(30) Foreign Application Priority Data

Jan. 11, 2002 (EP) ............................................ 02425009

(51) Int. Cl.[7] .............................................. G11C 16/04
(52) U.S. Cl. .............................. 365/185.13; 365/185.11; 365/185.12
(58) Field of Search ....................... 365/185.11, 185.12, 365/185.13, 230.06, 185.33

(56) References Cited

U.S. PATENT DOCUMENTS 5,748,528 A * 5/1998 Campardo et al. ...... 365/185.13
6,016,270 A 1/2000 Thummalapally et al. ...................... 365/185.11
6,400,603 B1 * 6/2002 Blyth et al. ............ 365/185.12
6,456,530 B1 * 9/2002 Micheloni et al. ...... 365/185.13
6,510,081 B2 * 1/2003 Blyth et al. ............ 365/185.12

FOREIGN PATENT DOCUMENTS

| EP | 0745995 | 12/1996 | ............ G11C/8/00 |
| EP | 1052647 | 11/2000 | ............ G11C/16/10 |
| WO | 98/28749 | 7/1998 | ............ G11C/16/06 |

* cited by examiner

Primary Examiner—Gene Auduong
(74) Attorney, Agent, or Firm—Allen, Dyer, Doppelt, Milbrath & Gilchrist, P.A.; Lisa K. Jorgenson

(57) ABSTRACT

A memory device includes an array of memory cells organized into a plurality of sectors, and local wordlines and local bitlines are connected to the memory cells in each respective sector. Main read wordlines and main program wordlines are connected to the local wordlines in each sector. A main read row decoder is connected to the main read wordlines, and a main program row decoder connected to the main program wordlines. Main read bitlines and main program bitlines are connected to the local bitlines in each sector. A main read column decoder is connected to the main read bitlines, and a main program column decoder is connected to the main program wordlines. A read address bus is connected to the main read row decoder and to the main read column decoder for providing an address thereto. A program address bus is connected to the main read column decoder and to the main program row decoder for providing an address thereto.

27 Claims, 4 Drawing Sheets

ARCHITECTURE FOR A FLASH-EEPROM SIMULTANEOUSLY READABLE IN OTHER SECTORS WHILE ERASING AND/OR PROGRAMMING ONE OR MORE SECTORS

FIELD OF THE INVENTION

The present invention relates to a flash EEPROM non-volatile memory device supporting simultaneous execution of different operations in different memory sectors of the memory device.

BACKGROUND OF THE INVENTION

The difficulty of reading data from memory sectors in which the data is stored, while erasing or programming other memory sectors, has always limited the performance of non-volatile FLASH memory devices. Erase operations that may be carried out per sector may last about 1 second, and the time required for programming or writing data in a certain memory sector is about the same or even longer.

During these intervals it is difficult to run a program code or read data even if the data is stored in a different sector from the ones involved in the erasing and/or programming operation. The problem is even more accentuated in the case of multi-level non-volatile memory devices, that is, memory devices in which more than one bit per cell may be stored. In these memory devices, the charge stored in the floating gate is fractioned and generates $2^{nb}$ distributions, where "nb" is the number of bits that may be stored in a single cell. The improved precision that is required is not limited only to the read operation but also to the programming process, and must ensure a correct positioning of an electrical charge in the cells according to the different distributions. This implies an increased duration of the verification and program routines.

To overcome such a severe limitation, an architecture that allows data to be accessed and read from different sectors while an erasing operation is being carried out in other sectors is disclosed in U.S. Pat. No. 5,748,528. The architecture described in this patent, besides requiring a non-negligible silicon area, still has some limits with respect to reading data from the memory while data is being erased or programmed in other sectors.

FIG. 1 illustrates the basic aspect of this known architecture. Not withstanding an advantageous order of row address lines or wordlines, called main wordlines (MWL), and an advantageous order of column address lines or bitlines, called main bitlines (MBL), the connection between a main wordline and the relative local wordlines as well as the connection among a main bitline and the relative local bitlines is realized through local row decoders LOCAL ROW DECODER and local column decoders LOCAL COLUMN DECODER. These local decoders implement a multiplexing function, for example a 4-to-1 multiplexing. In practice, four local bitlines correspond to a main bitline and two address bits are used to select which bitline of the four local bitlines must be connected to the corresponding main bitline.

Data is written in the cells of a certain sector SECTOR in the same way as normally done in a non-volatile, NOR type FLASH_EEPROM memory, that is, using channel hot electrons (CHE). The writing of data is carried out by applying a potential of about 10V on the control gate, a voltage of about 5V on the drain and leaving the source connected to ground. In these conditions an intense electric field between the isolated gate and the channel is generated, together with a relatively large current between the source and drain. This allows the electrons, which acquires a high kinetic energy on their travel from the source to the drain, to jump from the channel to the floating gate by overcoming the potential barrier formed by the tunnel oxide. This type of process is self-limiting. In fact, the negative charges accumulated in the floating gate reduce the initially generated electric field, thus contrasting progressively the cause of the charge accumulation.

The selected memory cell is biased to the programming conditions by selecting the relative main wordline and the relative local wordline that are biased at a positive programming voltage, and the main bitline and the local bitline that are biased at the programming drain voltage. This situation makes it difficult to bias to a reading condition other cells accessible through the same main wordline or through the same main bitline, even if they belong to a different sector of the matrix of memory cells.

There is the need of an architecture for a flash EEPROM non-volatile memory device that overcomes this inability of reading memory cells that, even if belonging to a different sector from that involved in the erasing and/or writing operations, are accessed through the same main wordlines and bitlines of the cells that are being erased and/or written, without excessively increasing the silicon area of the memory device.

SUMMARY OF THE INVENTION

The above mentioned and other requirements and objectives are effectively attained by the present invention relating to a new architecture of a non-volatile memory device based on the realization of two distinct orders, groups or types of main wordlines and bitlines, distinguishing a first order as main read wordlines and main read bitlines, and a second order as main program wordlines and main program bitlines. Each pair of main lines are associated with a certain number of local lines, for example four lines, in each sector of the array of memory cells. The subdivision of an array of elementary memory cells into banks and/or sectors is based upon the criteria normally used in the so-called hierarchical decoding structures of such a memory.

Distinct decoders are associated to the two distinct orders of main wordlines and main bitlines, the relative inputs of which are connected to two address buses for respective reading and programming/erasing operations. A first address bus coming from the address input pads of the device, through commonly used circuits, forms a path for the read addresses to be input to main read wordline decoders and to main read bitline decoders.

The input of the decoders of the main program wordlines and of the main program bitlines are, on the contrary, provided by a second address that is an internal bus. The input is generated by controllers for program and erase operations that control all the verification and load operations of data to be programmed.

Distinct addressing structures for read and program/erase operations advantageously leads to an advantage in terms of reduced silicon integration area. In fact, the read structures may always be biased to the read conditions, and thus structures such as local decoders, main row decoders, main and local column decoders may be optimized for such biasing conditions to minimize the required area.

The invention is particularly useful in the field of multi-level non-volatile memory devices. It allows a reduction of the program time beyond the technological limits of the device, by permitting simultaneous operations of verification (reading) and programming of cells belonging to different sectors or sub-sectors, as will be illustrated below.

DETAILED DESCRIPTION OF THE PREFERRED EMBODIMENTS

Figure 1:
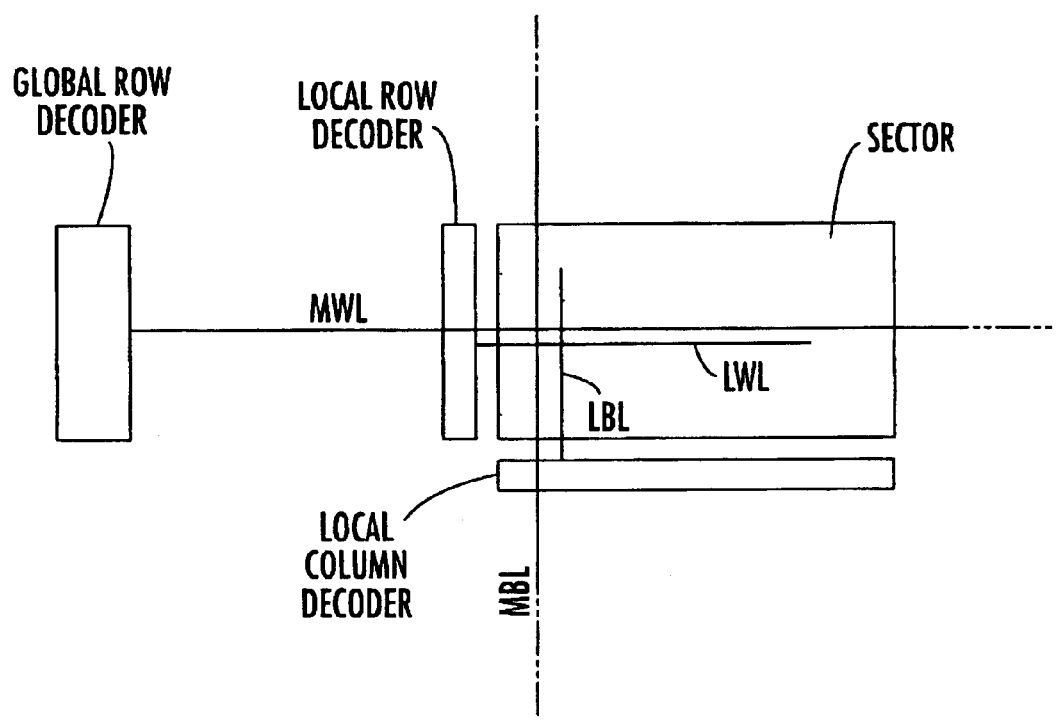
FIG. 1 shows the architecture of a flash EEPROM memory device of the prior art.
Figure 2:
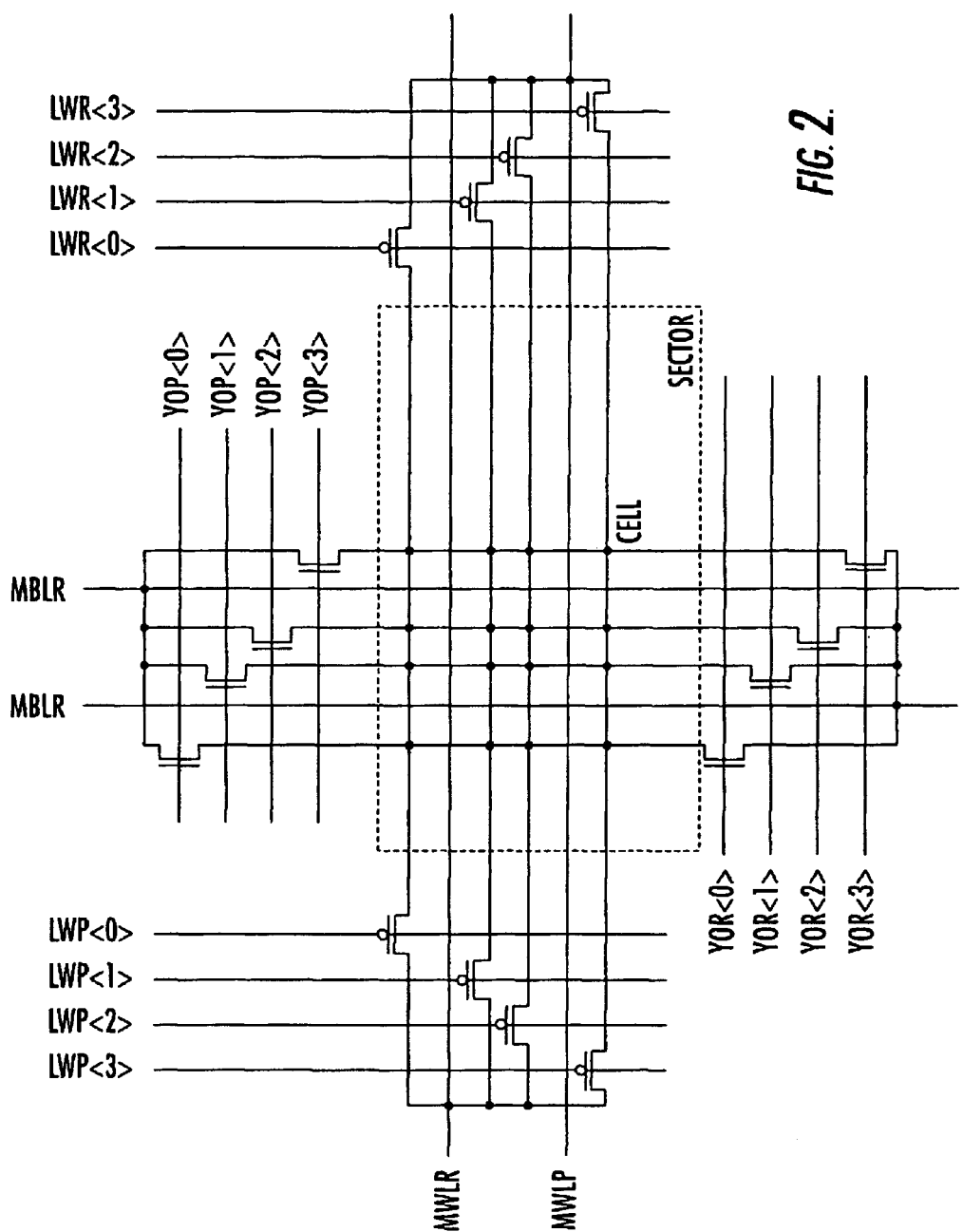
FIG. 2 is a basic circuit representation of the double local structure of row and column encoding according to the architecture of the present invention.

FIG. 2 highlights the fundamental aspect of the memory architecture of the present invention. The diagram, limited to a single sector SECTOR of the numerous sectors in which the array of memory cells CELL may be customarily divided, reveals the existence of two distinct types of main wordlines and main bitlines.

The main wordlines belong to two distinct groups or orders. One is the group of the main read wordlines, labeled MWLR, and the other is the group of the main program wordlines, labeled MWLP. Each pair of MWLR and MWLP lines is associated to the same subgroup of local wordlines, which in the example shown are four in each sector in which the memory cell array is divided.

Similar to the wordlines, there are also two distinct groups or orders of main bitlines. The main read bitlines, labeled MBLR, represent a first order or group, and the main program bitlines, labeled MBLP, represent the second order or group. The local bitlines and wordlines of each sector are coupled by dedicated local decoders to the respective main lines.

The diagram of FIG. 2 depicts an embodiment of the local decoding that permits each single cell of the sector to be addressed. In the diagram of FIG. 2 the decoding signals YOP<i> and YOR<i> allow the connection of the local lines alternatively to one or to the other order of main lines, that is, to main read lines or to main program lines.

Using the architecture of the invention depicted in FIG. 2 it is possible to select a flash memory cell in the read mode of a certain sector by applying to the selected cell the read gate voltage through the relative main read wordline MWLR. Simultaneously, any main program wordline can be selected, and through the selected wordline an appropriate program voltage may be applied to a local wordline of a different sector of the one in which the reading is in progress.

With the architecture of the present invention, it is possible to program through a certain main program wordline MWLP<n> and read through a certain main read wordline MWLR<m> without the restrictions of known devices, that is, even in the case in which m=n. Similarly, it is possible to program a cell by selecting a certain main program bitline MPLP<n> and read through any main read bitline MBLR<m> without the restrictions of known devices, that is, even in the case in which m=n.

Figure 3:
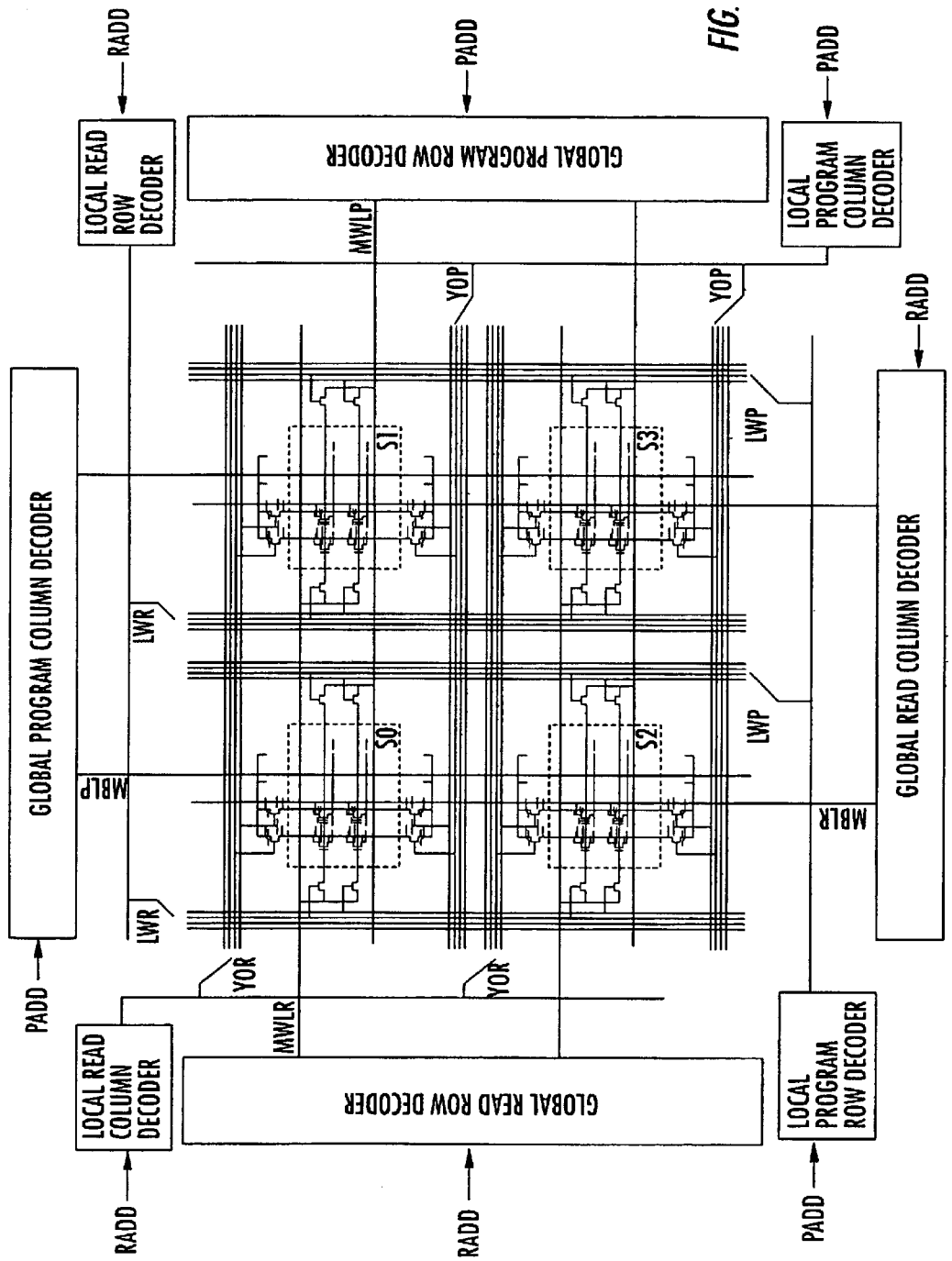
FIG. 3 is a more general diagram of the architecture of a memory device of the present invention.

FIG. 3 is a partial diagram that depicts the general architecture of the memory array, including the relative decoding structures. FIG. 3 depicts four distinct sectors S0, S1, S2 and S3 as well as the two pairs of decoders, respectively for the main read wordlines GLOBAL READ ROW DECODER and for the main program wordlines GLOBAL PROGRAM ROW DECODER, for the two main read bitlines GLOBAL READ COLUMN DECODER and for the main program bitlines GLOBAL PROGRAM COLUMN DECODER, and for the relative local decoders: LOCAL READ ROW DECODER, LOCAL PROGRAM ROW DECODER, LOCAL READ COLUMN DECODER and LOCAL PROGRAM COLUMN DECODER.

The architecture of the invention uses two distinct and independent address buses. The first address bus labeled RADD transmits the read addresses coming from the external pads of the device, while the other address bus labeled PADD carries the addresses of cells to be programmed and is controlled by a normal controller for the programming/erasing operations of the memory device.

As it may be observed from the diagram of FIG. 3, the read address bus RADD is the input of the read decoding structures while the program address bus PADD is the input of the program decoding structures. The scheme of the control signals for local column decoding is more easily understood when managing an array of m*n sectors.

The decoded signals that identify the row of the sectors corresponding to an address on the bus RADD and to an address on the bus PADD are respectively labeled LWR<n:0> and LWP<n:0>. The decoded signals that identify the column corresponding to a read address and to a program address are respectively labeled YOR<m:0> and YOP<m:0>.

The output lines of the driving stages of the control signals of the local decoders are enabled only if the corresponding signals LWR and YOM or if LWP and YOP are active. For example, it is sufficient to have LWR<0>=1, YOR<0>=1 and YOP<1>=1 for reading the sector 0 while programming the sector 2.

Should the local column decoding structure provide also a 4-to-1 multiplexing function (as is normally the case), the driving stages will have four output lines as depicted in the diagram of FIG. 2 and two address bits are dedicated to the selection of one of the four output lines.

The architecture of the invention, based on a complete distinction between the read mode and program mode selection structures, provides advantages in terms of reduction of the occupied silicon area. All the read structures, which are always biased at read conditions, may be freely optimized for that particular condition. This applies both to the local decoding as well as for the main row decoding and for the main column decoding.

The main read and program wordlines are selected by a main row decoder composed of two binary decoders. The first is input with the bus RADD and the second with the bus PADD. The advantage of this structure is that one of the two binary decoders, namely the GLOBAL READ ROW DECODER, is supplied with a constant read voltage WREAD that does not change as it does in prior art memory devices, while the other binary decoder, namely the GLOBAL PROGRAM ROW DECODER, is supplied with a program voltage that may be adjusted according to needs.

The full possibility of carrying out at the same time different operations offered by the novel architecture of the memory array requires, at a system level of the memory device, a congruent organization that allows one to exploit the advantages offered by the architecture of the invention.

Figure 4:
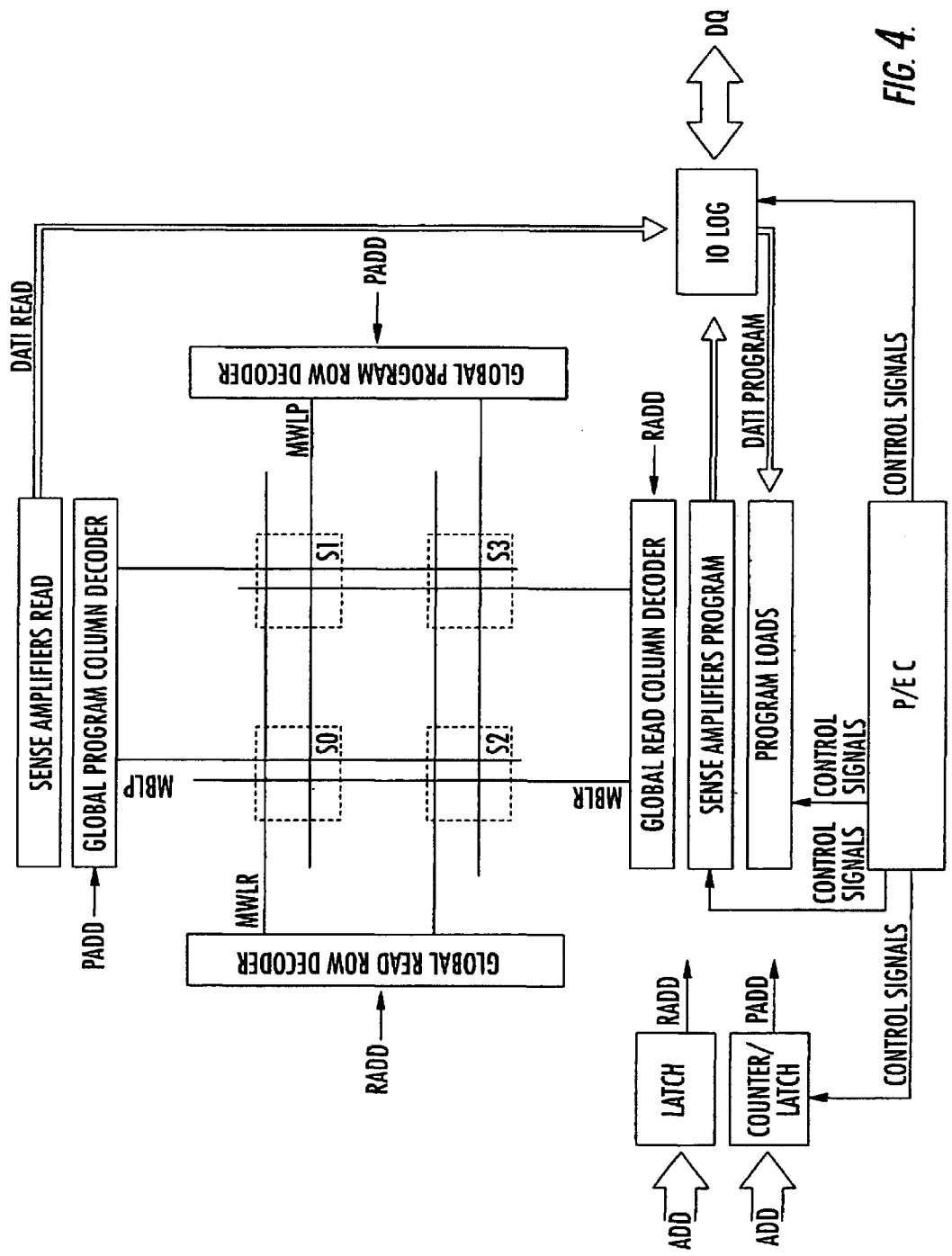
FIG. 4 is a scheme of the general organization of a memory device of the present invention.

FIG. 4 depicts a system organization of a memory device for carrying out at the same time reading and programming operations. As depicted at the top of the array of memory sectors SECTOR, the main read bitlines MBLR are coupled to a GLOBAL READ COLUMN DECODER that eventually selects the addressed main read bitline. The selected outputs are sent to the array of read amplifiers SENSE AMPLIFIERS READ that read the information and provide it through output logic circuitry to the input/output buffers I/O.

As shown at the bottom of the array of memory sectors, the main program bitlines MBLP are coupled to a GLOBAL PROGRAM COLUMN DECODER and the selected outputs are sent to the array of verification amplifiers SENSE AMPLIFIERS PROGRAM that carry out the operations of verifications during erase and/or program routines. Obviously, the outputs selected from the GLOBAL PROGRAM COLUMN DECODER are provided also to the circuitry of the block PROGRAM LOAD for applying the program voltage to the selected main bitline.

The array of verification amplifiers SENSE AMPLIFIERS PROGRAM dedicated to specific verification operations does not need to employ amplifiers having high speed characteristics, and this permits the relative silicon area to be minimized. The logic block labeled P/E C (Program/Erase Controller) controls all the verification and program load operations. A counter increments the address within a sector, according to well established techniques familiar to those skilled in the art.

The addresses ADD, coming from the input pads of the memory device, are directly sent to an address recording circuit LATCH whose output is the bus RADD. The same address ADD, coming from the input pads of the memory device, is sent to the bi-functional circuit COUNTER/LATCH that, whenever an erasing or a programming command is issued, stores the address.

The block COUNTER/LATCH stores the address to be programmed (LATCH function) and increments the address in the sector during an erasing phase (COUNTER function) according to the particular erasing algorithm in use. The output of the block COUNTER/LATCH is the bus PADD. During an erasing or programming phase, the circuits COUNTER/LATCH, PROGRAM LOADS, SENSE AMPLIFIERS PROGRAM and ID LOG are controlled by control signals CONTROL SIGNALS generated by the program/erase control circuit P/E C.

When a programming command is given, the circuit P/E C starts immediately the programming sequence by enabling the program lines corresponding to the stored address. Once the program command has been given and the programming address has been stored in the counter latch COUNTER/LATCH, a new address ADD can be accepted from the external input pads and read operations may be carried out while a previously started erase or program operation is in progress.

A particular utility of the invention is that it allows a significant reduction of program times of a multilevel nonvolatile memory. The advantages offered by a multilevel memory are typically accompanied with significant problems due to the shrinking of the difference among the threshold voltages corresponding to the various charge levels that may be stored in the floating gate and, thus, among the different conduction characteristics of the cells.

The programming of a multilevel memory cell requires an extremely precise control of the charge stored in the gate. It has been experimentally demonstrated and theoretically justified [B. Riccò, G. Torelli, M. Lanzoni, A. Manstretta, H. E. Maes, D. Montanari, and A. Modelli, "Non-volatile multilevel memories for digital applications", Proc. IEEE, vol. 86, pp. 2399–2421, December 1998.] that it is possible to establish a linear relation between the variation $\Delta V_G$ of the voltage applied to the gate in a programming phase and the threshold gap obtained with fixed values of $V_D$ and $V_S$. This allows the cell to be programmed by applying to its gate a linearly increasing voltage. Each programming pulse must differ from the previous one and from the next one by a constant value $\Delta V_G$. Therefore, the gate program voltage is a stepped voltage of constant steps. A significant result of this method is the fact that, by neglecting effects due to retention, temperature variations, etc., the width of the distribution characteristics of the threshold voltage corresponds to the step of the applied voltage. For this reason, it appears to be the best way of programming the memory cells to the desired voltage value, using the minimum number of pulses.

However, the above program mechanism is intrinsically slow because it requires the application of a succession of pulses to the gate of the cell. To obtain a program time of the single byte that may be compared to that of a conventional bi-level cell, it is thus necessary to program in parallel a plurality of cells.

By assuming that the program time of a single byte is 6 $\mu$s in the bi-level case, if 200 $\mu$s are necessary to run the whole program sequence, it is necessary to program 256 bits simultaneously to achieve an effective program time of 6 $\mu$s for each single byte.

The ambition of improving the performances of NOR type flash memory devices in order to achieve the same performance of ordinary NAND type devices, stimulates the search of approaches for reducing this program time, while always considering that the "channel hot electron" mechanism implies a current dissipation on the order of several tens of $\mu$A for each cell. By assuming to have availability of the current required for programming in parallel only 64 cells and of having a write buffer of 256 bits, the possible program phases are:

1. Application of two program pulses of 1.5 $\mu$s each (the duration of the pulse depends on the physical characteristic of the cells);

2. Bitline discharge: duration of 0.5 $\mu$s;

3. Transition of the supply of the row decoding structure from the program voltage to the verification voltage: duration of 2 $\mu$s;

4. Two verification phases for a total duration of 1 $\mu$s; and

5. Transition of the verification voltage to the successive program step: duration of 2 $\mu$s.

Each program pulse must last 8.5 $\mu$s and the procedure is repeated for each step. In the considered example this means repeating the routine 23 times. It must be noted that half of the time is taken by the transition of the supply voltage applied to the row decoding structure and not to physical characteristics of the cell.

Using a multi-supply hierarchical decoding architecture transition times of the row decoding structure are reduced to few tens of nanoseconds, thus halving the program time, compared with the classic method. Therefore, the total program time is the sum of the program pulse duration (that will be dictated by the physical characteristics of the memory cell) and of the time needed by the sense amplifier for carrying out the verification. If one does not wish or is unable to increase the current available for program operations (that means increasing the number of charge pumps and thus the silicon area of occupation of the device) and if one does not wish or is unable to employ a faster sense amplifier, it would not be possible according to the prior art to reduce further the program time.

Indeed, the architecture of the present invention allows one to overcome even this physical limit to optimize the program time by allowing verification while a programming is in progress. The architecture will be substantially similar to that of FIG. 4. The only difference would be that in the case of a multilevel memory device. Each sector will need to be subdivided in two half-sectors on which the double hierarchic decoding structure according to this invention will insist, as depicted in the diagram of FIG. 2.

The write buffer will be subdivided in two halves for the two half-sectors. While a program pulse is provided to a half-sector, a verification is carried out in the other half sector. Half of the write buffer is programmed while the other half is being verified.

That which is claimed is:

1. A memory device comprising:
    an array of memory cells organized into a plurality of sectors;
    local wordlines and local bitlines connected to said memory cells in each respective sector;
    addressing means for simultaneously addressing at least two of said sectors for performing an operation on at least one memory cell in a first sector while performing an operation on at least one memory cell in a second sector, said addressing means comprising
        main read wordlines and main program wordlines connected to said local wordlines in each sector,
        a main read row decoder connected to said main read wordlines, and a main program row decoder connected to said main program wordlines,
        main read bitlines and main program bitlines connected to said local bitlines in each sector,
        a main read column decoder connected to said main read bitlines, and a main program column decoder connected to said main program bitline,
        a local read row decoder and a local program row decoder connected to said local wordlines in each sector,
        a local read column decoder and a local program column decoder connected to said bitlines in each sector,
        a read address bus connected to said main read row decoder and to said main read column decoder for providing a first address corresponding to at least one memory cell in the first sector, and
        a program address bus connected to said main program row decoder and to said main program column decoder for providing a second address corresponding to at least one memory cell in the second sector.

2. A memory device according to claim 1, wherein the operations performed on said memory cells comprise at least one of reading, erasing and programming.

3. A memory device according to claim 1, wherein said main read row wordlines and said main program row wordlines are respectively associated with four local wordlines through said local read row decoder and said local program row decoder; and wherein said main read bitlines and said main program bitlines are respectively associated with four local bit lines through said local read column decoder and said local program column decoder.

4. A memory device according to claim 1, further comprising a latch connected to said read address bus for providing a pre-coded read address thereto.

5. A memory device according to claim 1, further comprising a bi-functional circuit connected to said program address bus for storing program addresses, and for incrementing an internal address of a sector being erased.

6. A memory device according to claim 1, further comprising an array of read amplifiers for reading data from said memory array; and an array of program amplifiers for verifying programming during their writing in said memory array.

7. A memory device according to claim 1, wherein each sector is subdivided into halves so that said memory cells are configured as multilevel memory cells; and wherein the simultaneous addressing further includes performing an operation on a memory cell in a first half sector while performing an operation on a memory cell in a second half sector of the same sector.

8. A memory device according to claim 1, wherein said array of memory cells are configured so that the memory device is a flash EEPROM device.

9. A memory device comprising:
    an array of memory cells organized into a plurality of sectors;
    local wordlines and local bitlines connected to said memory cells in each respective sector;
    main read wordlines and main program wordlines connected to said local wordlines in each sector;
    a main read row decoder connected to said main read wordlines, and a main program row decoder connected to said main program wordlines;
    main read bitlines and main program bitlines connected to said local bitlines in each sector;
    a main read column decoder connected to said main read bitlines, and a main program column decoder connected to said main program wordlines;
    a read address bus connected to said main read row decoder and to said main read column decoder for providing a first address corresponding to a memory cell in a first sector;
    a program address bus connected to said main read column decoder and to said main program column decoder for providing a second address corresponding to a memory cell in second sector; and
    the memory cells in the first and second sectors being simultaneously addressed via said read and program address buses.

10. A memory device according to claim 9, wherein said main read wordlines and said main program wordlines, said main read bitlines and said main program bitlines, and said local wordlines and local bitlines in each respective sector allows an operation to be performed on the memory cell in the first sector based upon the first address while an operation is being performed on the memory cell in the second sector based upon the second address.

11. A memory device according to claim 9, further comprising:
    a local read row decoder and a local program row decoder connected to said local wordlines in each sector; and
    a local read column decoder and a local program column decoder connected to said local bitlines in each sector.

12. A memory device according to claim 9, wherein the operations performed on said memory cells comprise at least one of reading, erasing and programming.

13. A memory device according to claim 11, wherein said main read row wordlines and said main program row wordlines are respectively associated with four local wordlines through said local read row decoder and said local program row decoder; and wherein said main read bitlines and said main program bitlines are respectively associated with four local bitlines through said local read column decoder and said local program column decoder.

14. A memory device according to claim 9, further comprising a latch connected to said read address bus for providing a pre-coded read address thereto.

15. A memory device according to claim 9, further comprising a bi-functional circuit connected to said program address bus for storing program addresses, and for incrementing an internal address of a sector being erased.

16. A memory device according to claim 9, further comprising an array of read amplifiers for reading data from said memory array; and an array of program amplifiers for verifying programming during their writing in said memory array.

17. A memory device according to claim 9, wherein each sector is subdivided into halves so that said memory cells are configured as multilevel memory calls; and wherein the simultaneous addressing further includes performing an operation on a memory cell in a first half sector while performing an operation on a memory cell in a second half sector of the same sector.

18. A memory device according to claim 9, wherein said array of memory cells are configured so that the memory device is flash EEPROM device.

19. A method for simultaneously addressing at least two different memory sectors within a memory device, the memory device comprising local wordlines and local bitlines connected to the memory cells in each respective sector; main read wordlines and main program wordlines connected to the local wordlines in each sector; a main read row decoder connected to the main read wordlines, and a main program row decoder connected to the main program wordlines; main read bitlines and main program bitlines connected to the local bitlines in each sector; and a main read column decoder connected to the main read bitlines, and a main program column decoder connected to the main program wordlines, the method comprising:

providing a first address to a read address bus connected to the main read row decoder and to the main read column decoder for selecting a memory cell in a first sector;

providing a second address to a program address bus connected to the main read column decoder and to the main program column decoder for selecting a memory cell in a second sector; and the first and second addresses being provided simultaneously so that an operation on the memory cell in the first sector is being performed while an operation on the memory cell in the second sector is being performed.

20. A method according to claim 19, wherein the memory device further comprises a local read row decoder and a local program row decoder connected to the local wordlines in each sector; and a local read column decoder and a local program column decoder connected to the local bitlines in each sector.

21. A method according to claim 20, wherein each sector is subdivided into halves so that the memory cells are configured as multilevel memory cells; and wherein the simultaneous addressing further includes performing an operation on a memory cell in a first half sector while performing an operation on a memory cell in a second half sector of the same sector.

22. A method according to claim 19, wherein the operations performed on the memory cells comprise at least one of reading, erasing and programming.

23. A method according to claim 22, wherein the main read row wordlines and the main program row wordlines are respectively associated with four local wordlines through the local read row decoder and the local program row decoder; and wherein the main read bitlines and the main program bitlines are respectively associated with four local bitlines through the local read column decoder and the local program column decoder.

24. A method according to the claim 19, wherein the memory device further comprises a latch connected to the read address bus for providing a pre-coded read address thereto.

25. A method according to claim 19, wherein the memory device further comprises a bi-functional circuit connected to the program address bus for storing program addresses, and for incrementing an internal address of a sector being erased.

26. A method according to claim 19, wherein the memory device further comprises an array of read amplifiers for reading data from the memory cells; and an array of program amplifiers for verifying programming during their writing in the memory cells.

27. A method according to claim 19, wherein the memory cells are configured so that the memory device is a flash EEPROM device.

* * * * *